United States Patent
Chang-Hasnain et al.

(10) Patent No.: US 12,136,798 B2
(45) Date of Patent: Nov. 5, 2024

(54) VERTICAL CAVITY SURFACE EMITTING DEVICE WITH A BURIED INDEX GUIDING CURRENT CONFINEMENT LAYER

(71) Applicant: THE REGENTS OF THE UNIVERSITY OF CALIFORNIA, Oakland, CA (US)

(72) Inventors: Constance J. Chang-Hasnain, Palo Alto, CA (US); Jiaxing Wang, Albany, CA (US); Kevin T. Cook, Berkeley, CA (US); Jonas H. Kapraun, Albany, CA (US); Emil Kolev, Pacifica, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 970 days.

(21) Appl. No.: 17/090,850

(22) Filed: Nov. 5, 2020

(65) Prior Publication Data
US 2021/0159668 A1   May 27, 2021

Related U.S. Application Data

(63) Continuation of application No. PCT/US2019/031698, filed on May 10, 2019.
(Continued)

(51) Int. Cl.
*H01S 5/00* (2006.01)
*H01S 5/042* (2006.01)
(Continued)

(52) U.S. Cl.
CPC ........ *H01S 5/18308* (2013.01); *H01S 5/0424* (2013.01); *H01S 5/04256* (2019.08);
(Continued)

(58) Field of Classification Search
CPC .............. H01S 5/18308; H01S 5/0424; H01S 5/04256; H01S 5/125; H01S 5/18377;
(Continued)

(56) References Cited

U.S. PATENT DOCUMENTS 5,985,686 A * 11/1999 Jayaraman .......... H01S 5/18391
372/45.01
6,169,756 B1    1/2001 Chirovsky
(Continued)

FOREIGN PATENT DOCUMENTS

WO    2019217802 A1    11/2019

OTHER PUBLICATIONS

ISA/KR, Koreapn Intellectual Property Office (KIPO), International Search Report and Written Opinion Issued Aug. 30, 2019, related PCT international application No. PCT/US2019/031698, pp. 1-13, claims searched, pp. 14-19.
(Continued)

*Primary Examiner* — Kinam Park
(74) *Attorney, Agent, or Firm* — O'BANION & RITCHEY LLP; John P. O'Banion

(57) ABSTRACT

A vertical cavity surface emitter device (e.g., VCSEL or RC-LED) containing a buried index-guiding current confinement aperture layer which is grown, and lithographically processed to define position, shape and dimension of an inner aperture. In a regrowth process, the aperture is filled with a single crystalline material from the third contact layer. The aperture provides for both current and optical confinement, while allowing for higher optical power output and improved thermal conductivity.

23 Claims, 8 Drawing Sheets

Related U.S. Application Data

(60) Provisional application No. 62/670,078, filed on May 11, 2018.

(51) Int. Cl.
*H01S 5/125* (2006.01)
*H01S 5/183* (2006.01)
*H01S 5/20* (2006.01)
*H01S 5/22* (2006.01)
*H01S 5/227* (2006.01)
*H01S 5/343* (2006.01)

(52) U.S. Cl.
CPC .......... *H01S 5/125* (2013.01); *H01S 5/18377* (2013.01); *H01S 5/18394* (2013.01); *H01S 5/2081* (2013.01); *H01S 5/209* (2013.01); *H01S 5/2223* (2013.01); *H01S 5/2275* (2013.01); *H01S 5/3434* (2013.01)

(58) Field of Classification Search
CPC .... H01S 5/18394; H01S 5/2081; H01S 5/209; H01S 5/2223; H01S 5/2275; H01S 5/3434
See application file for complete search history.

(56) References Cited

U.S. PATENT DOCUMENTS

| | | | |
|---|---|---|---|
| 6,487,230 B1* | 11/2002 | Boucart | H01S 5/426 372/45.01 |
| 2001/0043629 A1* | 11/2001 | Sun | H01S 5/426 257/E33.069 |
| 2003/0108075 A1* | 6/2003 | Kim | H01S 5/18338 372/46.013 |
| 2003/0185267 A1* | 10/2003 | Hwang | H01S 5/18358 372/96 |
| 2004/0165636 A1* | 8/2004 | Ezaki | H01S 5/18313 372/96 |
| 2009/0029496 A1 | 1/2009 | Schmid | |
| 2010/0189147 A1* | 7/2010 | Ji | H01S 5/18333 438/45 |
| 2012/0020383 A1 | 1/2012 | Shimizu | |
| 2018/0019572 A1 | 1/2018 | Deppe | |
| 2019/0020177 A1* | 1/2019 | Deppe | H01S 5/18358 |

OTHER PUBLICATIONS

State Intellecual Property Office of the People's Republic of China, First Office Action notification issued Jun. 1, 2023, related Chinese patent application No. 100082, Chinese-language document pp. 1-9, English-language translation, pp. 10-18, claims examinedm pp. 19-24.

* cited by examiner

VERTICAL CAVITY SURFACE EMITTING DEVICE WITH A BURIED INDEX GUIDING CURRENT CONFINEMENT LAYER

CROSS-REFERENCE TO RELATED APPLICATIONS

This application claims priority to, and is a 35 U.S.C. § 111(a) continuation of, PCT international application number PCT/US2019/031698 filed on May 10, 2019, incorporated herein by reference in its entirety, which claims priority to, and the benefit of, U.S. provisional patent application serial number 62/670,078 filed on May 11, 2018, incorporated herein by reference in its entirety. Priority is claimed to each of the foregoing applications.

The above-referenced PCT international application was published as PCT International Publication No. WO 2019/217802 A1 on Nov. 14, 2019, which publication is incorporated herein by reference in its entirety.

STATEMENT REGARDING FEDERALLY SPONSORED RESEARCH OR DEVELOPMENT

Not Applicable

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to vertical cavity surface emitting optoelectronic circuits, and more particularly to a vertical cavity surface emitting optoelectronic circuit having a buried index guiding current confinement layer.

2. Background Discussion

Vertical cavity surface emitters (VCSEs) including the vertical cavity surface emitting lasers (VCSELs) and resonant-cavity light emitting diodes (RC-LEDs) have many applications such as telecommunication, sensing and printing. Moreover, tunable VCSELs are becoming increasingly important as light sources for optical coherent tomography (OCT) and frequency-modulated continuous-wave (FMCW) light detection and ranging (LIDAR) systems. VCSEL arrays have found applications as light sources in 3D sensing and time of flight LIDAR systems. These vertical cavity surface emitting devices have many advantages over edge emitting devices. First, the vertical geometry of VCSEL devices result in a small footprint, which enables fabrication of a high density of devices on the wafer, and facilitates wafer scale testing; both of which lead to lower cost per device. Secondly, the direct modulation speed of a vertical cavity device is significantly faster than an edge emitting device, due to the smaller device size of the vertical device. Although the single device light output of VCSE devices have a low power output, the possibility of forming two-dimensional arrays presents a way to obtain higher optical powers. Lastly, the circular output light beam makes them the ideal light source for coupling into the optical fiber.

Vertical cavity surface emitting optoelectronic devices usually incorporate the following structures. An active region is sandwiched between two high-reflectivity mirrors. P-contact layer and n-contact layer are placed to form a p-i-n junction around the active region. Electrodes are deposited on the contact layers to provide for injection of electric current. Additionally, for those vertical cavity surface emitting devices, a small volume region (lateral dimensions from approximately 2 to 20 µm) is necessary for confining both the current injection and the internal optical mode in lateral direction. For VCSELs this lateral confinement enables high current densities necessary to reach the lasing threshold, while limiting the threshold current and power dissipation of the device. As a result, higher device efficiency can be achieved.

To provide lateral confinement in vertical surface emitters, the concept of etching devices into pillars was proposed, in which index guiding is observed because of the refraction index difference between the semiconductor and air. However, this method suffers from surface recombination of carriers at the exposed interface between semiconductor and air which translates to a parasitic recombination current. Furthermore, optical absorption at surface states leads to optical losses. Moreover, Aluminum containing layers in the device are exposed to the air and gradually oxidize which causes device reliability issues.

Two other methods, specifically ion implantation and oxidized aperture, were proposed to achieve lateral confinement in vertical cavity surface emitting devices. Ion implantation creates crystal vacancies in the semiconductor material, which compensate the free carriers in the semiconductor thus forming highly resistive regions that restrict and thereby confine the current flow to non-implanted regions on the device. Ion implantation suffers from at least two disadvantages: (1) the crystal is damaged by ion-implantation that will cause reliability problems and limit performance of the device; and (2) this method does not create a refraction index profile along the lateral direction. This lack of an index-guiding element causes devices to support multiple transverse modes. Optical links based on lasers with multiple transverse modes are subject to limits in their data rate and range and result in a higher relative laser noise intensity and noise created by chromatic and modal dispersion in the optical fiber.

An aperture formed by a partially oxidized AlGaAs or AlAs layer provides index guiding as well as lateral current confinement. However, the porous Aluminum oxide layer gives rise to multiple issues. The mechanical instability of the porous Aluminum oxide layer and its absorption of water from the atmosphere in its oxide layer, can cause damage and lower the reliability of oxide-confined devices. Moreover, the heat resistance of the oxide is significantly higher than that of the surrounding semiconductor, which limits the dissipation of heat from the active region and thus reduces the performance of high-power devices and arrays of devices.

Accordingly, a need exists for improved mechanisms for performing index guiding. The present disclosure fulfills that need and provides additional benefits.

BRIEF SUMMARY

A vertical cavity surface emitter with a buried index-guiding current confinement aperture layer is described which overcomes many shortcomings of prior current indexing concepts. After growing a second contact layer on the active region, an index-guiding current confinement layer is produced by several steps of epitaxial regrowth with a lithography method to define the position, shape and dimension of the inner aperture in it, and removing the area of the inner aperture. After forming the index-guiding current confinement layer, a third contact layer with the same doping type with the second contact layer is epitaxially grown (single crystalline structure). On the third contact layer, a final top reflector is grown with the same type of doping as the second and third contact layers.

In addition, those embodiments may be formed as vertical-cavity surface-emitting lasers (VCSELs) or resonant-cavity light-emitting diodes (RC-LEDs), or other optoelectronic structures having a resonant cavity. Also, in accordance with the presented technology, the active region may include one or more quantum-well layers sandwiched between cladding layers.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

DETAILED DESCRIPTION

A vertical cavity surface emitter device structure (e.g., VCSEL or RC-LED) containing a buried index-guiding current confinement aperture. The structure in at least one embodiment has a bottom distributed Bragg reflector (DBR) mirror (reflector) stack, having a first type of doping, and is grown epitaxially on a semiconductor substrate having the same first type of doping. It will be appreciated that semiconductor doping comprises two general types, n-type doping and p-type doping. Then, the first contact layer with the same type of doping is grown on top of the bottom DBR, followed by an undoped active region as gain material. Another contact layer with a different type doping from the first contact layer is grown on the active region.

After the second contact layer, the index-guiding current confinement layer is formed utilizing several steps of epitaxial regrowth with a lithographic method to define the position, shape and dimension of its inner aperture.

After the index-guiding current confinement layer aperture is created, a third contact layer with the same doping type as the second contact layer is epitaxially grown. On the third contact layer, a final top DBR mirror with the same type doping as the second and third contact layer is grown. Either wet etch or dry etch methods may be utilized to define one or more mesas in the structure. Then the top contact is formed over the top DBR reflector (mirror) and the bottom contact is formed on the back of the bottom DBR reflector (mirror), or substrate, to inject current. A high contrast grating (HCG) can also be utilized as the top or bottom reflector. Also, the contacts can be formed on the contact layers. Thus, in a second embodiment, the top contact is formed on the third contact layer, and the bottom contact is formed on the first contact layer. In at least one embodiment, an HCG replaces the top DBR stack as a top reflector. Aside from its high reflectivity, the HCG layer also controls the polarization of the light output, which depending on the types of HCG, can provide emission polarization which is either parallel or perpendicular to the grating bars in the HCG.

Since the index-guiding current confinement layer is produced by way of regrowth on the lithography defined pattern, it may not be possible to planarize the surface after regrowth if the dimension of the pattern is large. It should be appreciated, however, that even if the surface is not entirely flat, the conformal DBR or HCG top reflector (mirror) can still provide sufficient reflectivity for device operation.

Figure 1:
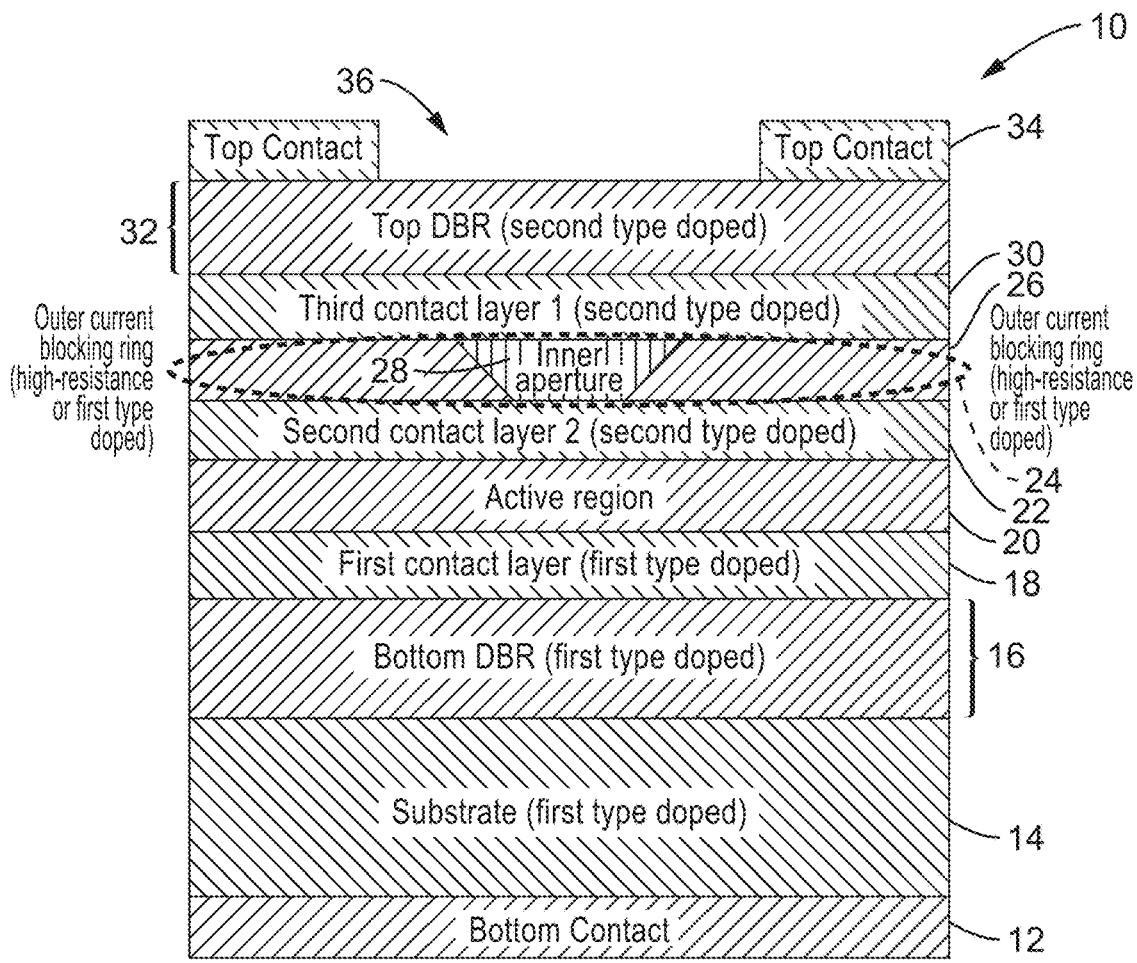
FIG. 1 is a cross-sectional schematic of a first embodiment of vertical cavity surface emitting optoelectronic device according to an embodiment of the present disclosure.

FIG. 1 illustrates a first example embodiment 10 of vertical cavity surface emitting device (e.g., resonant cavity light emitting diode (RC-LED) or vertical cavity surface emitting laser (VCSEL)) device grown on substrate 14 having a first type of doping. The epitaxially grown structure above the substrate is as follows. A bottom DBR 16 having a first type of doping, is followed by a first contact layer 18 of a first type doping, an active region 20, the second contact layer 22 having a second type doping, then an index-guiding current confinement layer 24 which includes inner aperture portion 28 and outer current blocking ring portion 26, followed by a third contact layer 30 having the second type doping, and a top DBR 32 having the second type doping. During fabrication after growth, the upper portion of the device can be etched from the sides (e.g., from upper reflector down to at least the index-guiding current confinement layer 24) to form at least one mesa. Top contact 34 is deposited on the top of the top DBR 32, and bottom contact 12 is deposited below the bottom DBR, depicted herein as on the underside of substrate 14.

The material used to form the vertical surface cavity emitting device 10 can be III-V or II-V compound semiconductor. The two types of doping generally refer to n-type doping which render a semiconductor material with free electrons and p-type doping which renders a semiconductor having 'free holes' for electrons. In at least one embodiment, the active region 20 preferably has quantum wells with from 1 to 20 pairs sandwiched in the larger-bandgap cladding layer which confines the carrier in the quantum wells.

The top 16 and bottom 32 reflectors (mirrors) are depicted in this embodiment as DBR reflectors, which are formed by alternating layers of high and low refractive index materials. The top and bottom reflectors form the vertical cavity and the active region operates as a gain material.

Figure 2:
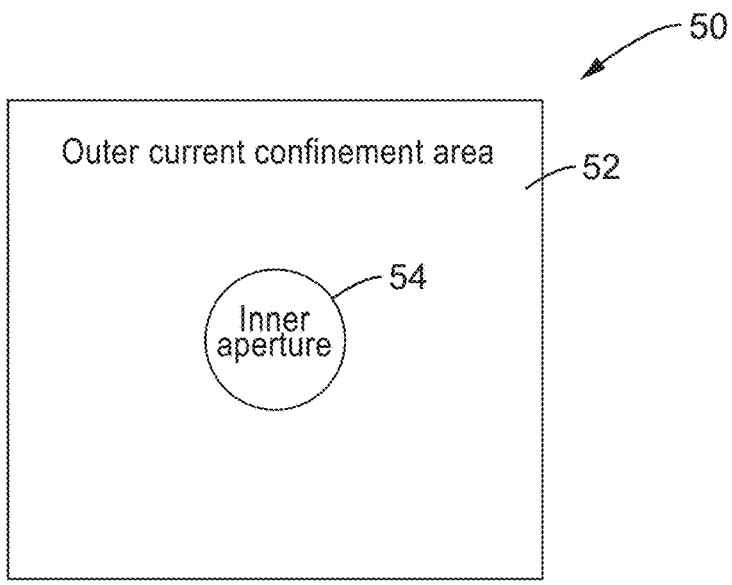
FIG. 2 is a top view of an index-guiding current confinement layer utilized according to an embodiment of the present disclosure.

FIG. 2 illustrates an example embodiment 50 of a plan view of the index-guiding current confinement layer as was seen in FIG. 1 elements 24, 26, 28 formed by multiple processing steps. In FIG. 2, the first growth is terminated by outer current blocking layer 52, then lithography is used to define the inner aperture 54, followed by a selective etch to etch a hole, thus forming inner aperture 54 in the outer current blocking layer.

After lithography and selective etch, the wafer carrying the device substrate is returned back to the chamber for a second growth. The second growth fills the hole of the inner aperture with a material that has a larger refraction index, and is more electrically conductive, than the original material of confinement layer 24 seen in FIG. 1. The second growth stage also grows the structures above the index-guiding current confinement layer 24. Top and bottom contacts are metallic and provide ohmic contact with the semiconductor for current injection. The semiconductor layers are usually grown by molecular beam epitaxy (MBE) or metal-organic chemical vapor deposition (MOCVD), although other techniques may be suitable. The mesa etching can be performed by a number of methods, including wet etching with a selected etchant, or dry etching for example using inductively-coupled plasma (ICP) etching or reactive ion etching (RIE). The metal contact deposition can be performed in a number of ways, such as by utilizing electron beam (EB) deposition or sputtering.

The vertical cavity surface emitting device can be a VCSEL which usually requires that the reflectivity of the top and bottom mirrors are larger than 99% to provide a suitable quality factor. The vertical cavity surface emitting device may also comprise a resonant cavity light emitting diode (RC-LED) which requires significantly lower levels of mirror reflectivity (usually lower than 90%) which still provides sufficient light output while preventing lasing over the operating current range. The following describes an example implementation of this first embodiment.

EXAMPLE 1

In the following example, the vertical cavity surface emitting device is a VCSEL, which by way of example and not limitation, is configured to operate at a wavelength of 980 nm. All the semiconductor layers can be grown by MOCVD on a thick Si-doped n-type GaAs substrate having a doping level of around 1E18 $cm^{-3}$. The bottom DBR stacks are first grown on the substrate, and by way of example only, were fabricated with 33.5 pairs of periodic AlAs/GaAs. They are also doped by Si with approximately a 1E18 $cm^{-3}$ doping concentration. The thicknesses of AlAs and GaAs are approximately 82.6 nm and 69.6 nm, which are 980 nm quarter-wavelength in AlAs and GaAs respectively. On the DBR stacks, the first contact layer is then grown of approximately a 270 nm thick GaAs with about a 1E18 $cm^{-3}$ Si doping concentration. After the first contact layer, a 77 nm Al60GaAs spacer layer is placed for phase-match purpose. The active region follows the spacer layer growth, and consists of approximately a 115 nm undoped Al30GaAs bottom cladding layer, three pairs of undoped 5.5 nm InGaAs/10 nm GaAsP strain compensated multiple quantum well (MQW) and 115 nm undoped Al30GaAs upper cladding layer. The second carbon doped p-type contact layer is grown after the active region. The doping concentration is approximately 2E18$cm^{-3}$ and thickness is approximately 135 nm. The first growth terminates with 100 nm Si-doped n-type $In_{0.49}Ga_{0.51}P$ current blocking layer, which is lattice-matched to GaAs.

The wafer is taken out of the chamber after the first growth. Lithography is used to expose about a 10 μm diameter circular shape on the InGaP current blocking layer, the remaining area on the wafer is masked with photoresist. An etchant, such as a mixed etchant of HCl, $H_3PO_4$ and $H_2O$, is used to etch the InGaP current blocking layer to form a circular hole through the photoresist window in creating the aperture through the current blocking layer. Then the wafer is returned to the chamber for the second growth after the photoresist mask is removed.

The second growth starts with a p-GaAs growth, grown to a diameter of approximately 1.215 μm as a third contact layer to fill the hole and planarize the surface. The doping level of the fill material is around 2E18 $cm^{-3}$. It should be appreciated, that although the shape of the inner aperture is shown as circular, it can be non-circular of any desired shape, such as in the shape of a square, hexagon, octagon, triangle, rectangle, and so forth to achieve certain beam shape controlling.

After growth of the third contact layer a DBR stack (multiple layers with alternating high and low refractive index) was grown, exemplified here as a 22.5 pair carbon-doped p-type AlAs/GaAs DBR stack, and having a doping level of around 2E18 $cm^{-3}$. And finally, the second growth ends with about a 20 nm carbon heavily doped p++ GaAs layer to form ohmic contact with the metal.

After epitaxy the wafer moves onto to fabrication steps. At first a conductive material, exemplified as Ti/Au, is deposited on the top of the p++ GaAs and on the back of the n-type GaAs substrate. Then etching is performed, such as using a wet mesa etch performed using $H_2SO_4$:$H_2O_2$:$H_2O$=1:6:180, with the upper portion of the sides etched away down to the bottom DBR stack.

The surface of the finished device is planarized by second growth control; however, the device can still operate with a conformal surface if the surface is not flattened by the regrowth. Also, the reflectors (mirrors) can be fabricated using high contrast gratings (HCGs), which can control the optical polarization of the emitted light.

Although the above example, and the other examples given, describe use of GaAs material, specific wavelengths, layer depths, doping and process steps, the present disclosure is not limited to these specific implementation details.

Figure 3:
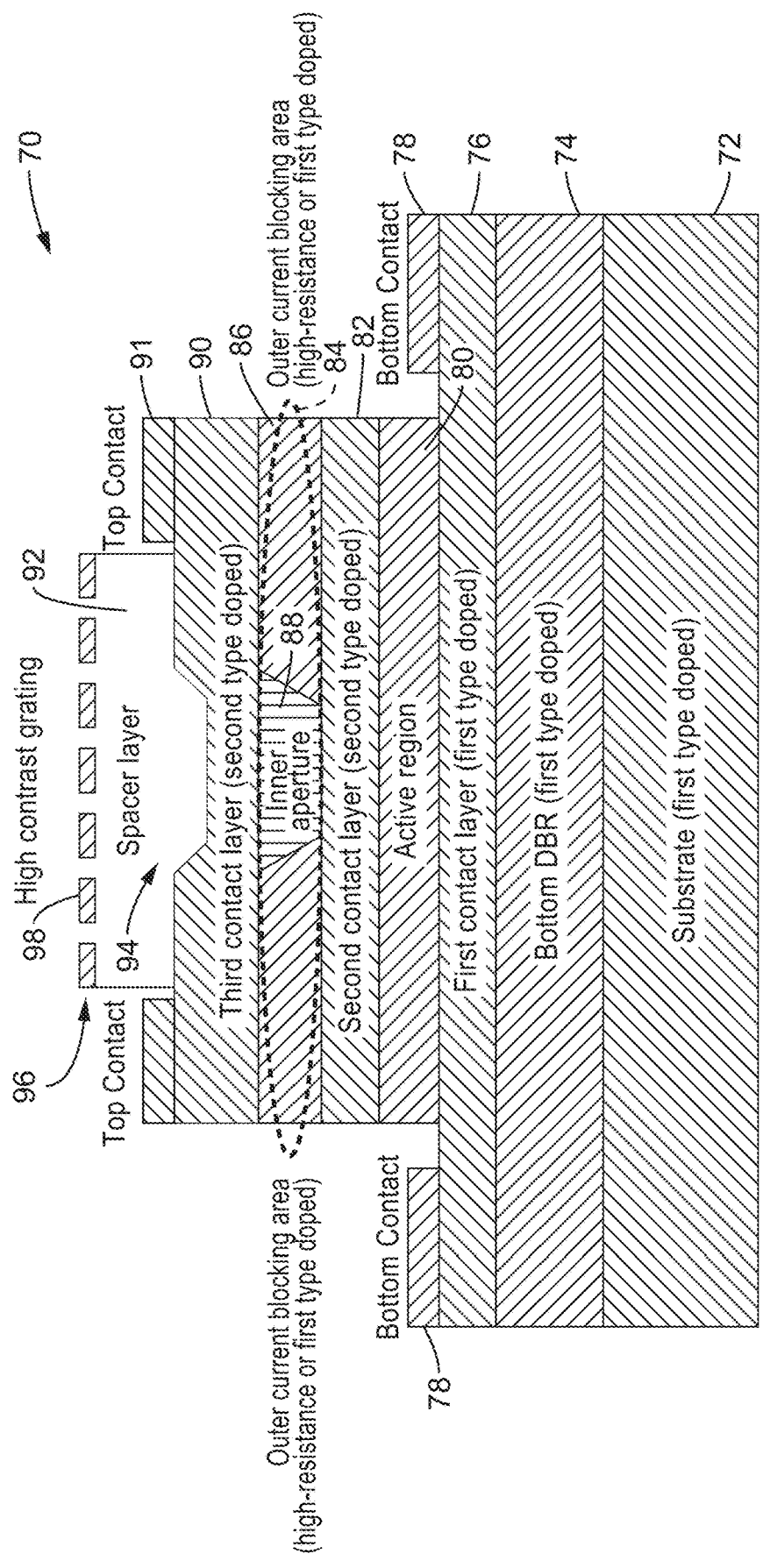
FIG. 3 is a cross-sectional schematic of a second embodiment of vertical cavity surface emitting optoelectronic device according to an embodiment of the present disclosure.

FIG. 3 illustrates an example of the second embodiment 70 described above. It is seen from the figure that the vertical cavity surface emitting device is grown on a substrate 72 with a first type of doping. The epitaxially grown structure above the substrate are a bottom DBR 74 (a first type doping), first contact layer 76 (first type doping), active region 80, second contact layer 82 (with a second type of doping), index-guiding current confinement layer 84 having inner aperture 88 and outer current blocking area 86, third contact layer 90 (second type doping), HCG lower index spacer layer 92 removed to form spacer layer 94, HCG grating layer 98 etched to form a grating pattern. Metal contacts 78, 91 are formed on top of the first and third contact layers. The thickness, period and duty cycle parameters of the HCG layer are carefully designed to form a high-reflectivity mirror.

Fabrication steps are performed after growth, with the device etched from the sides spanning down from the top to the first contact layer 76 to form a mesa. Top contact 91 is deposited on the top of third contact layer 90, and bottom contact 78 is deposited on top of the first contact layer 76. Electron Beam lithography is used to define the HCG top mirror 96. The following is an implementation example of this second embodiment.

Figure 4:
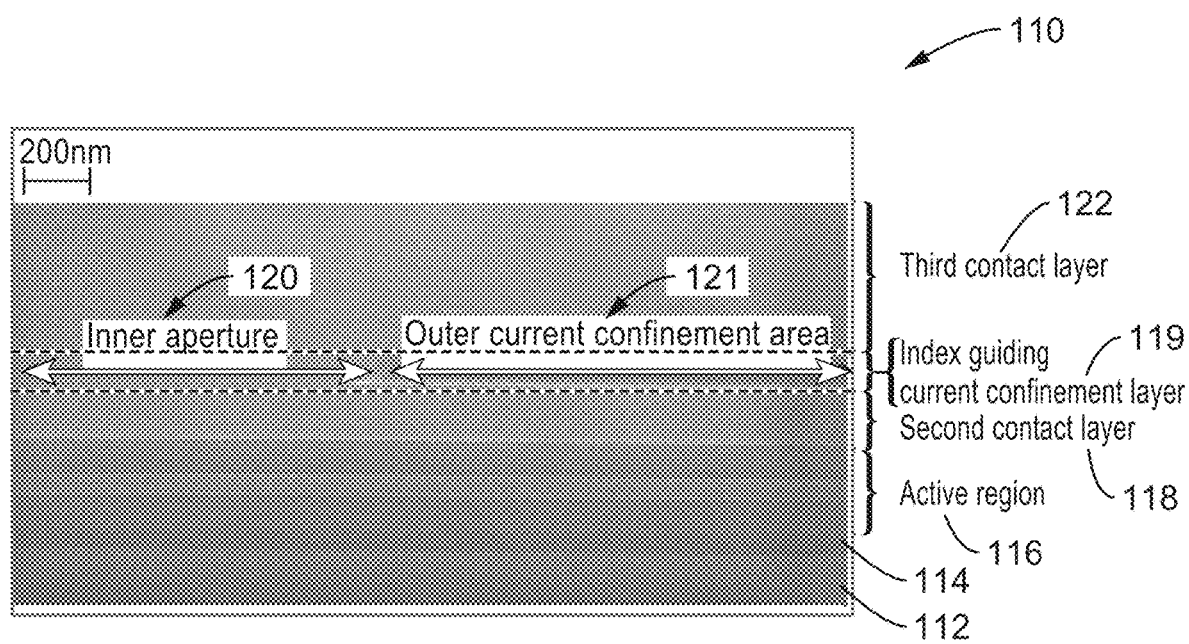
FIG. 4 is a scanning electron microscope (SEM) image depicting elements of the index-guiding current confinement layer according to an embodiment of the present disclosure.

FIG. 4 illustrates an example embodiment 110 of the index guiding current confinement layer as seen by SEM images showing only a small portion of the overall structure, and specifically a right side portion with the inner aperture (which is actually generally centered in the device) as being off to the left side of the image. A small portion of first contact layer 112 is seen covered by a phase-matched spacer 114, over which is active region 116, above which is a second contact layer 118. Then above the second contact layer 118 is the index guiding current confinement layer 119, with inner aperture 120 and outer current confinement area 121 of that layer being shown. Above the index guiding current confinement layer is a third contact layer 122.

EXAMPLE 2

Figure 5A:
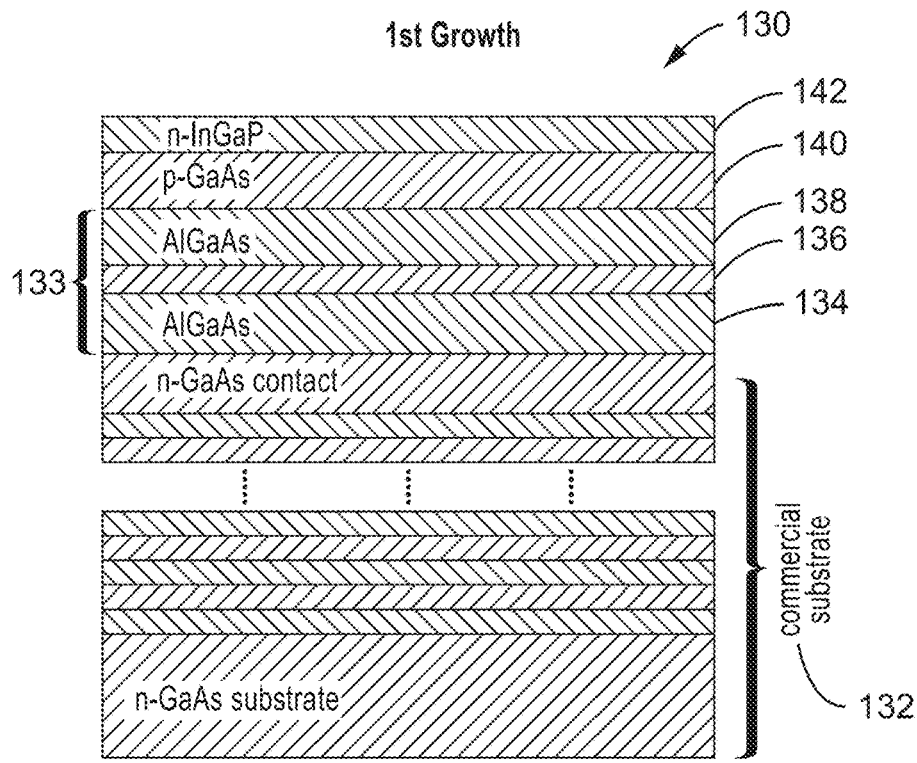
FIG. 5A through FIG. 5C are cross-sectional schematics of process steps for fabricating the vertical cavity surface emitting optoelectronic device according to the second embodiment of the present disclosure.
Figure 5B:
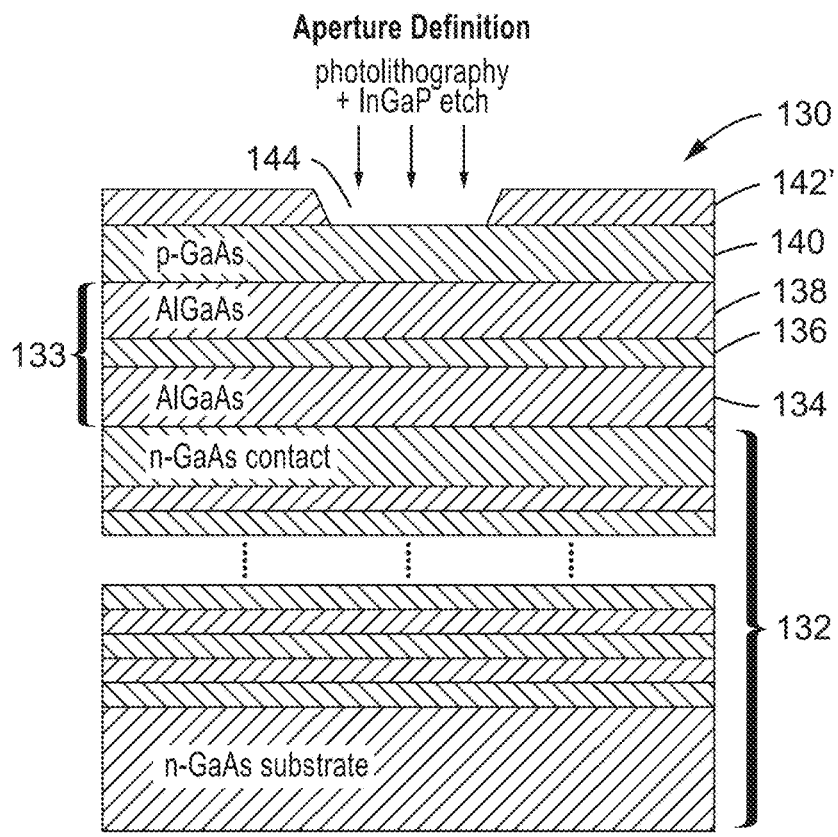
Figure 5C:
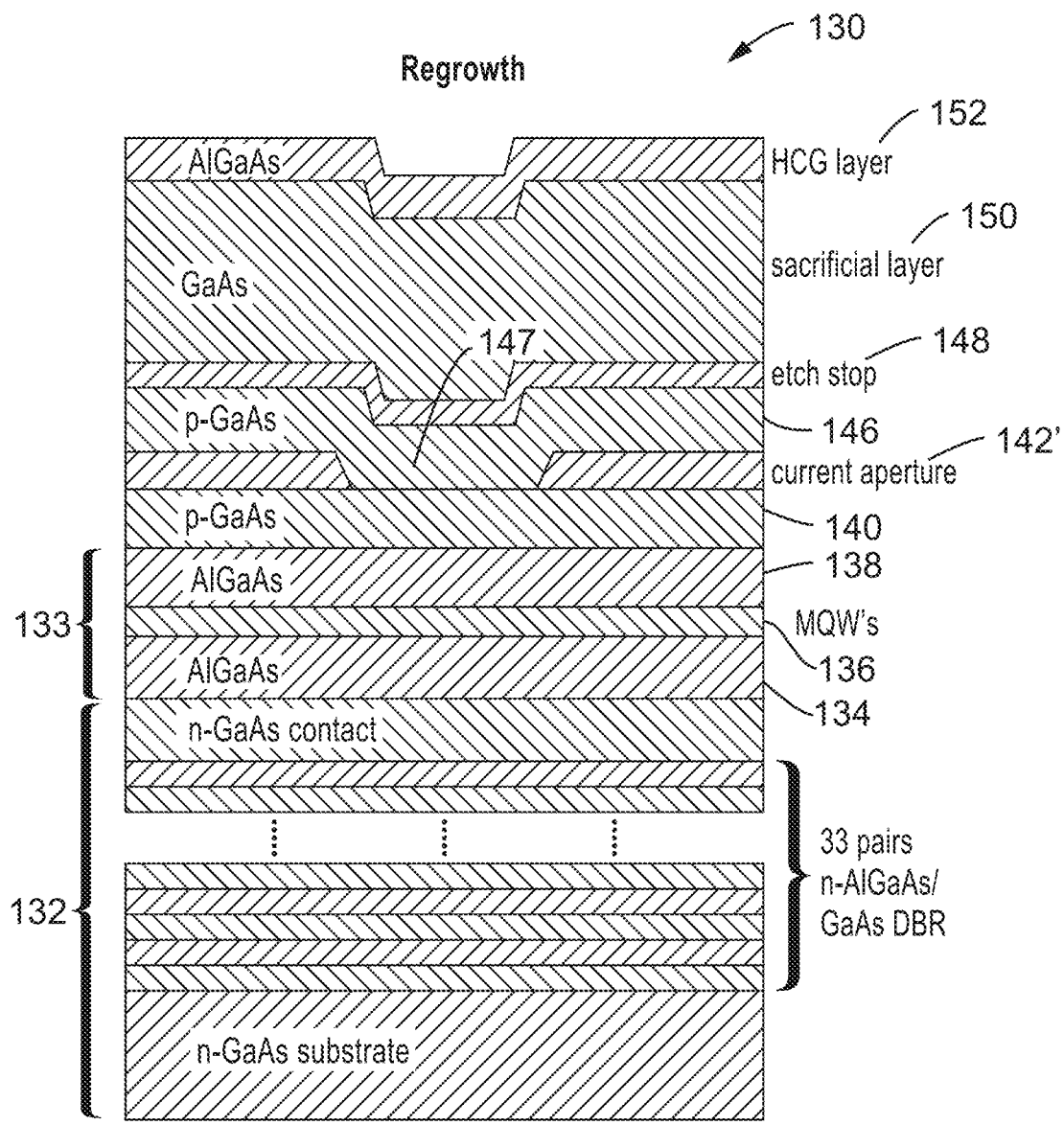

FIG. 5A through FIG. 5C illustrate a second example embodiment 130 depicting a growth procedure of another VCSE configured to have a wavelength of 980 nm. All the semiconductor layers can be grown by MOCVD on a thick Si-doped n-type GaAs substrate. Doping level of the substrate is around 1E18 $cm^{-3}$. The bottom DBR stacks are first grown on the substrate. The DBR stacks are exemplified with 33.5 pairs of periodic AlAs/GaAs. They are also doped by Si with about a 1E18 $cm^{-3}$ doping concentration. The thicknesses of AlAs and GaAs are approximately 82.6 nm and 69.6 nm, respectively, which are 980 nm quarter-wavelength in AlAs and GaAs respectively. On the DBR stacks, the first contact layer is then grown, with approximately a 270 nm thick GaAs with about a 1E18 $cm^{-3}$ Si doping concentration. These layers are depicted in the figure as being part of commercial substrate 132 seen in FIG. 5A Growth of the active region 133 follows growth of the first contact layer. The active region in this example consists of 100 nm undoped AlGaAs bottom cladding layer 134, five pairs of undoped 5.5 nm InGaAs/10 nm GaAsP strain compensated multiple quantum well (MQW) 136 and 100 nm undoped AlGaAs upper cladding layer 138.

The second carbon doped p-type contact layer 140 is grown after the active region, having a doping concentration of about 2E18 $cm^{-3}$ and the thickness of approximately 135 nm. The first growth terminates with about a 100 nm Si-doped n-type $In_{0.49}Ga_{0.51}P$ current blocking layer 142, which is lattice-matched to GaAs.

The wafer, having the structure seen in FIG. 5A is taken out of the chamber after the first growth. Lithography is performed to expose approximately a 10 μm diameter circular shape (or other non-circular shape) on the $In_{0.49}Ga_{0.51}P$ current blocking layer, the remaining area on the wafer is masked with photoresist. An etchant, such as a mixed etchant of HCl, $H_3PO_4$ and $H_2O$, is used to etch the InGaP current blocking layer to form a hole through the photoresist window and through current blocking layer 142' creating aperture 144 seen in FIG. 5B. Then the wafer is returned to the chamber for the second growth after the photoresist mask is removed.

In FIG. 5C the regrowth process is seen starting with growing a p-GaAs layer 146 of approximately a 135 nm thick carbon doped p-GaAs third contact layer that is grown to fill the aperture 144 of FIG. 5B, shown extending 147 down into that aperture of layer 142'. An etch stop layer 148 is grown comprising about a 20 nm $In0.49Ga_{0.51}P$ layer which follows the recess contour of layer 146. Afterwards, a 1.1 μm GaAs sacrificial layer 150, followed by about a 270 nm Al60GaAs HCG layer 152 are grown. In this example, the surface is not planarized, with the wafer moving to fabrication steps after the above epitaxy steps.

Figure 6A:
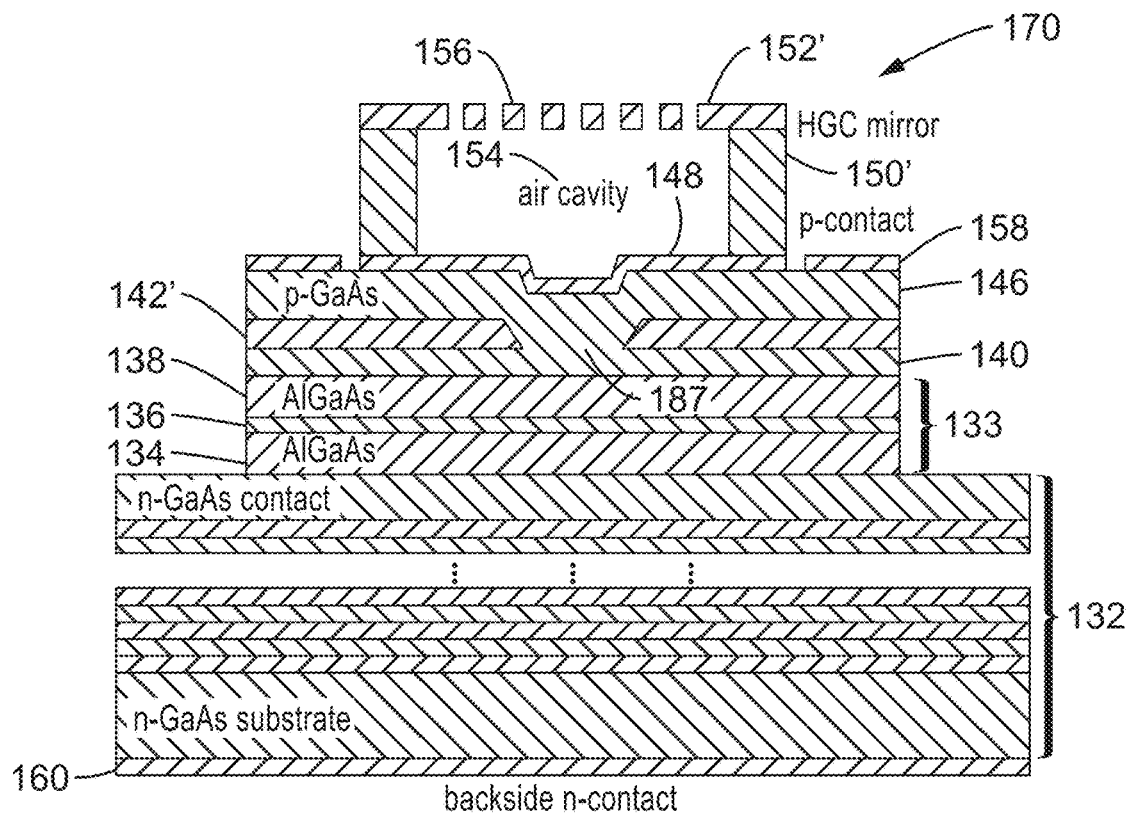
FIG. 6A through FIG. 6C are a cross-sectional schematic and SEM image renditions of a vertical cavity surface emitting optoelectronic device according to the second embodiment of present disclosure.
Figure 6B:
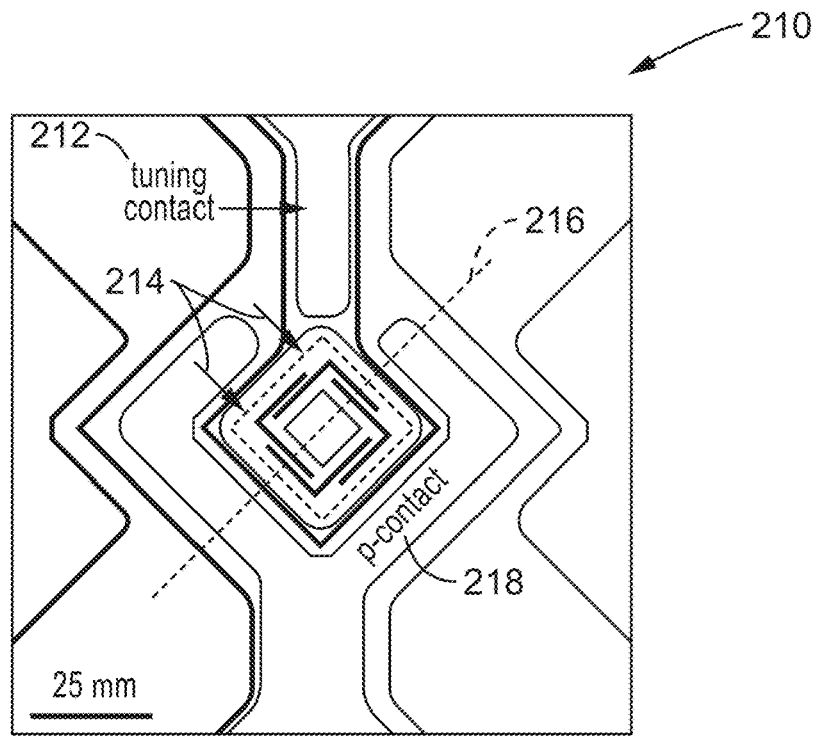
Figure 6C:
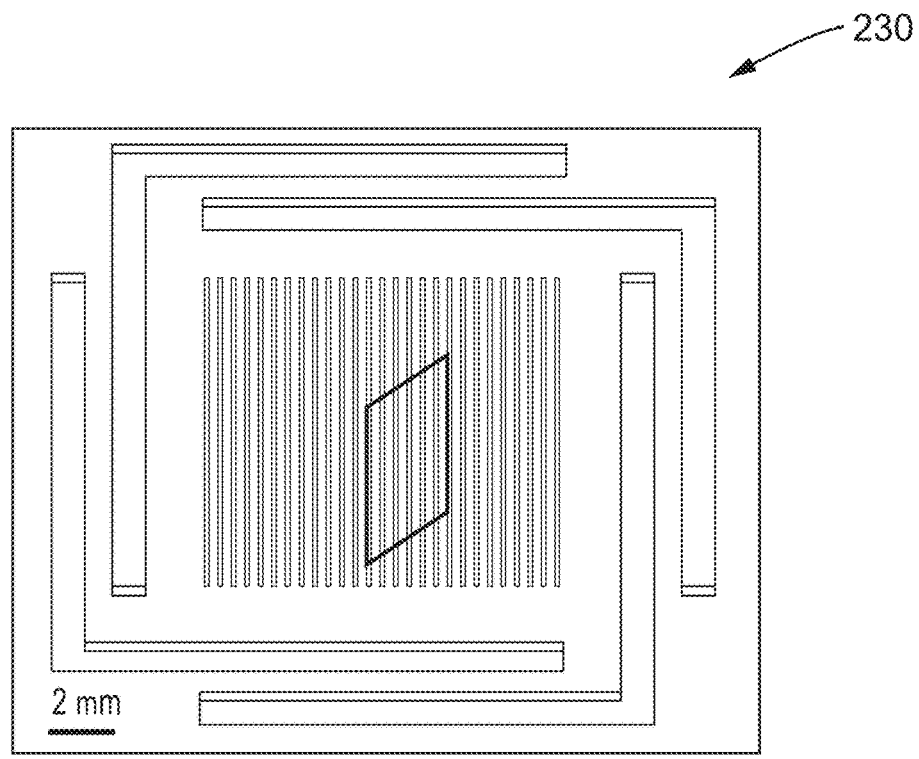

FIG. 6A through FIG. 6C illustrate an example embodiment 170, 210, 230 of the resultant VCSEL device from FIG. 5A through FIG. 5C, after completing the following fabrication steps.

Referring to FIG. 6A a metallic material exemplified as Ti/Au, is used as the top contact 158 on the third contact layer 146 as p-pad and Au/Ge/Ni/Au is deposited on the backside of the substrate as an n-pad 160. An etch is performed, exemplified as a wet etch with $H_2SO_4:H_2O_2:H_2O=1:6:180$ to define the mesa. Electron beam lithography and sacrificial layer etch are used to define the high-reflectivity HCG top mirror 152' with its grating bars 156, and the air cavity 154.

In FIG. 6B is seen a rendition of an SEM image of the VCSEL showing tuning contact 212, markings 214 for the area of the mesas with centerline 216 and p-contact 218.

In FIG. 6C is seen a rendition of an SEM image of the VCSEL showing only the upper mesa region 230.

Figure 7:
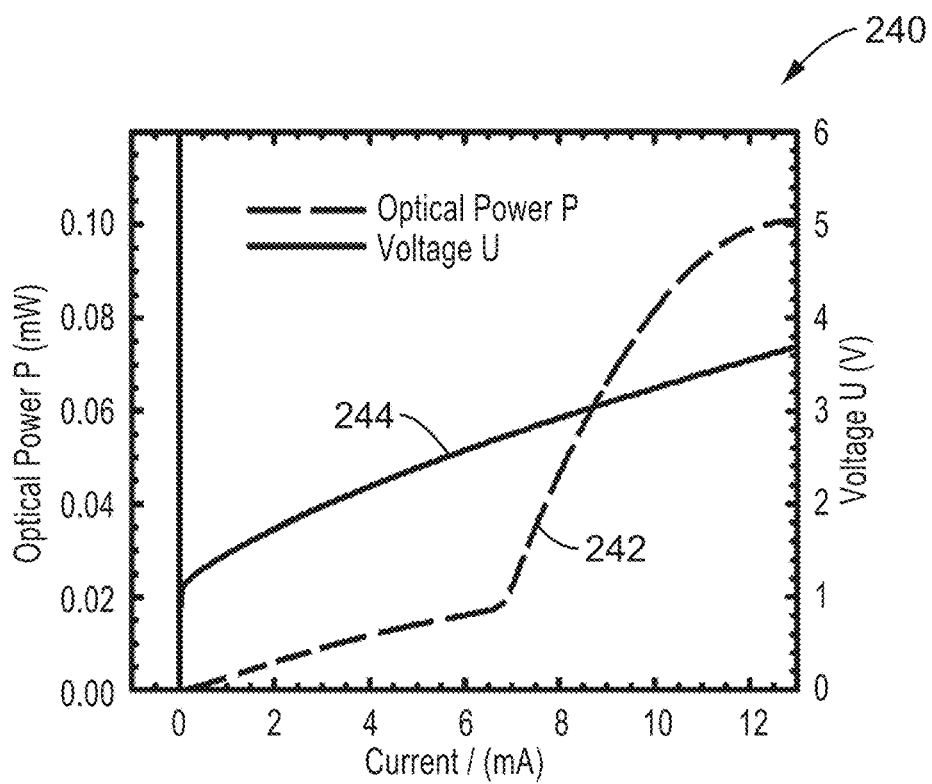
FIG. 7 is a plot of light-current-voltage (LIV) curves for the device shown in FIG. 6A according to an embodiment of the present disclosure.

FIG. 7 illustrates a light-current-voltage (LIV) curve 240 showing optical power 242 and voltage 244.

Figure 8:
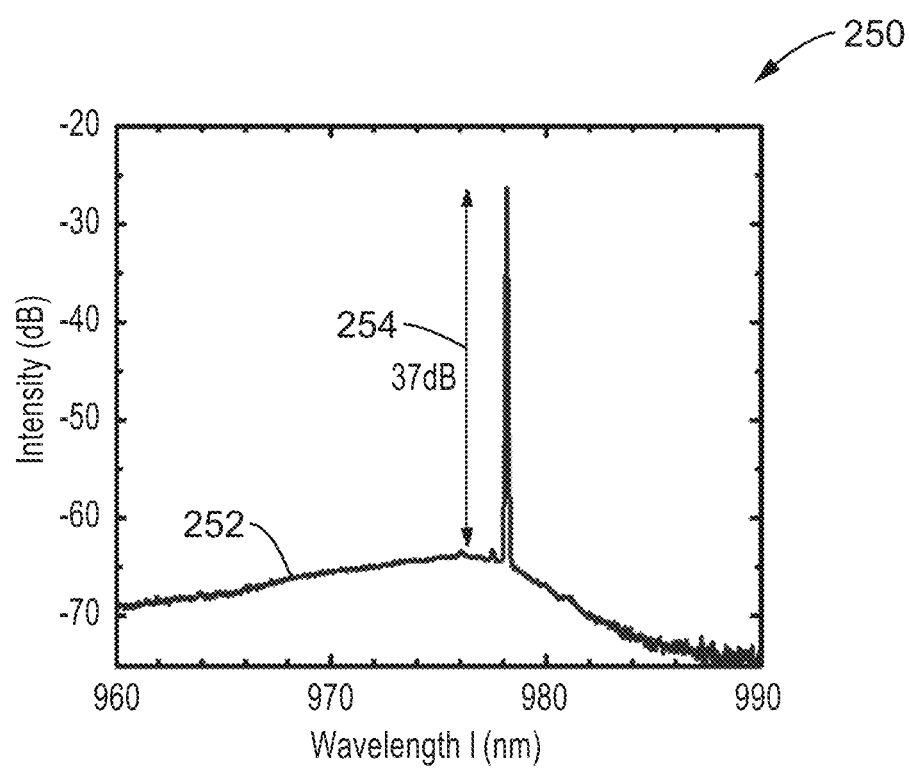
FIG. 8 is a plot of light spectrum obtained from the device shown in FIG. 6A according to an embodiment of the present disclosure.

FIG. 8 illustrates a light spectrum 250 of the VCSEL device showing baseline intensity 252, and intensity gain of about 37 dB at the design frequency.

From the foregoing description, it will be appreciated that the presented technology has various new features and aspects, and may provide numerous advantages over conventional technology, which include, but are not limited to, the following. (a) Both current and optical confinement is achieved with an aperture layer consisting solely of single crystalline material, which greatly improves the reliability of the device. (b) Compared to the oxide defined aperture, the refractive index contrast between aperture center and its surrounding in the presented technology is smaller. The resulting weaker index-guiding effect supports large-aperture single transverse mode devices with an emission of smaller numeric aperture facilitating high efficiency fiber coupling. Additionally, the large current aperture enables potentially higher optical powers. (c) The new aperture layer has higher thermal conductivity, which provides an efficient path to dissipate heat from the device; which is essential for realizing high-power devices. (d) The shape of the aperture has a high degree of design freedom; for example one could design an aperture specifically to obtain certain transverse modes and beam shapes. (e) The technology provides a high degree of design freedom for the placement of the apertures which can facilitate designing densely packed VCSEL arrays.

Accordingly the presented technology attains a number of design goals. (1) A novel layer is provided which provides for both lateral current confinement and also lateral light confinement. (2) Reliability of vertical cavity surface emitting devices is increased according to the present disclosure. (3) The disclosed structures provide improved heat dissipation to enhance operation at higher operation current levels. (4) The disclosed technology can provide mechanisms and fabrication steps for attaining high-power single transverse mode vertical cavity surface emitting devices.

Embodiments of the present technology may be described herein with reference to flowchart illustrations of methods and systems according to embodiments of the technology, and/or steps and operations.

From the description herein, it will be appreciated that the present disclosure encompasses multiple embodiments which include, but are not limited to, the following:

1. A vertical cavity surface emitting optoelectronic apparatus comprising: (a) a top reflector and bottom reflector; (b) a first contact layer above said bottom reflector and having a first type of doping; (c) an active region located above said first contact layer and containing one or more quantum well layers; (d) a second contact layer above said active region and having a second type of doping; (e) an index-guiding current confinement layer above said second contact layer, said index-guiding current confinement layer having a central aperture; and (f) a third contact layer, having a second type of doping, positioned over said index-guiding current confinement layer and filling the central aperture of said index-guiding current confinement layer.

2. A method of fabricating a vertical cavity surface emitting optoelectronic device, comprising: (a) forming a bottom reflector on a substrate having a first type of doping; (b) forming a first contact layer, having the first type of doping, above the bottom reflector; (c) forming an active region, containing one or more quantum well layers, located above the first contact layer; (d) forming a second contact layer, having a second type of doping, above the active region; (e) forming an index-guiding current confinement layer above said second contact layer, (f) performing lithography and etching out of a central aperture in the index-guiding current confinement layer; (g) performing a regrowth operation in forming third contact layer, having a second type of doping, positioned over said index-guiding current confinement layer and which fills the central aperture of said index-guiding current confinement layer; and (h) forming a bottom electrode and a top electrode configured for coupling operating current between them into said vertical cavity surface emitting optoelectronic device.

3. A vertical cavity surface emitting device comprising: (a) a substrate; (b) a couple of semiconductor layers grown on the substrate, including a bottom mirror, a contact layer with the first type doping (the first contact layer), an active region above the contact layer, the second type doped contact layer (the second contact layer) above the active region with one index-guiding current confinement layer buried inside; wherein the index-guiding current confinement layer has an aperture at the center; a top mirror above the second contact layer; (c) a bottom electrode either on the back of the substrate or on the top of the first contact layer; (d) a top electrode either on the top of the top mirror or on the top of the third contact layer; and (e) a mesa extending downward through the semiconductor layers.

4. The apparatus or method of any preceding embodiment, wherein said apparatus comprises a vertical-cavity surface-emitting laser (VCSEL) or a resonant-cavity light-emitting diode (RC-LED).

5. The apparatus or method of any preceding embodiment, wherein said vertical-cavity surface-emitting laser (VCSEL) or resonant-cavity light-emitting diode (RC-LED), comprises an electrically pumped device or an optically pumped device.

6. The apparatus or method of any preceding embodiment, wherein said one or more quantum well layers are sandwiched between cladding layers.

7. The apparatus or method of any preceding embodiment, further comprising electrodes comprising a bottom electrode and top electrode.

8. The apparatus or method of any preceding embodiment, wherein said bottom electrode is beneath a substrate which is beneath said bottom reflector.

9. The apparatus or method of any preceding embodiment, wherein said bottom electrode is on top of said first contact layer.

10. The apparatus or method of any preceding embodiment, wherein said top electrode is on top of said top reflector.

11. The apparatus or method of any preceding embodiment, wherein said top electrode is on top of said third contact layer.

12. The apparatus or method of any preceding embodiment, wherein said apparatus is formed with at least one mesa.

13. The apparatus or method of any preceding embodiment, wherein the index-guiding current confinement layer is configured as an as-grown layer for which no further oxidation or ion implantation is performed after epitaxy.

14. The apparatus or method of any preceding embodiment, wherein said index-guiding current confinement layer comprises an inner current injection aperture and an outer current blocking ring which are distributed laterally in said index-guiding current confinement layer.

15. The apparatus or method of any preceding embodiment, wherein said inner current injection aperture is conductive to said second contact layer to define a current channel into said active region.

16. The apparatus or method of any preceding embodiment, wherein said outer current blocking ring is either of a sufficiently high resistance, or is oppositely doped to said second contact layer, to confine current into said inner current injection aperture in said index-guiding current confinement layer.

17. The apparatus or method of any preceding embodiment, wherein said inner current injection aperture has a higher refraction index than said outer current blocking ring toward providing lateral index guiding.

18. The apparatus or method of any preceding embodiment, wherein said inner current injection aperture and said outer current blocking ring can be selected from the group of aperture/ring material pairs consisting of: GaAs/InGaP, AlGaAs/InGaP, GaAs/InAlGaP, AlGaAs/InAlGaP, InGaAs/InP, InAlGaAs/InP.

19. The apparatus or method of any preceding embodiment, wherein said inner current injection aperture is circular having a diameter in a range from approximately 100 nm to 50 μm 20. The apparatus or method of any preceding embodiment, wherein said inner current injection aperture can be of a non-circular shape having a width in a range from approximately 100 nm to 50 μm 21. The apparatus or method of any preceding embodiment, wherein said index-guiding current confinement layer has a thickness in a range from approximately 10 nm to 2000 nm.

22. The apparatus or method of any preceding embodiment, wherein said bottom reflector and said top reflector comprises either a distributed Bragg reflector (DBR) or a high-contrast grating (HCG) reflector.

23. The apparatus or method of any preceding embodiment, wherein said top reflector is either flat or distorted from conformal second growth.

24. The apparatus or method of any preceding embodiment, wherein said active region includes quantum well or quantum wells and cladding layers on both sides of said quantum-well or quantum-wells.

25. The apparatus or method of any preceding embodiment, wherein each quantum well comprises a well layer and a barrier layer.

26. The apparatus or method of any preceding embodiment, further comprising etching the exteriors of multiple layers to form at least one mesa.

27. The apparatus or method of any preceding embodiment, wherein the index-guiding current confinement layer is formed as an as-grown layer upon which no oxidation or ion implantation steps are performed after epitaxy.

28. The apparatus or method of any preceding embodiment, wherein said index-guiding current confinement layer is etched forming an inner current injection aperture around which is an outer current blocking ring.

29. The apparatus or method of any preceding embodiment, wherein the inner current injection aperture is filled with conductive material of said third contact layer down to the second contact layer defining a current channel into the active region.

30. The apparatus or method of any preceding embodiment, wherein the buried index-guiding current confinement layer is an as-grown layer, wherein this buried index-guiding current confinement layer doesn't need further oxidation or ion implantation after epitaxy.

31. The apparatus or method of any preceding embodiment, wherein the buried index-guiding current confinement layer comprises two parts: the inner current injection aperture and the outer current blocking ring, and are distributed laterally in the buried index-guiding current confinement layer.

32. The apparatus or method of any preceding embodiment, wherein the buried index-guiding current confinement layer is finished by multiple step epitaxy.

33. The apparatus or method of any preceding embodiment, wherein the inner current injection aperture is conductive to the second contact layer to define a current channel into the active region.

34. The apparatus or method of any preceding embodiment, wherein the outer current blocking ring is high-resistance or oppositely doped to the second contact layer to confine the current into the aperture in the buried index-guiding current confinement layer.

35. The apparatus or method of any preceding embodiment, wherein the inner current injection aperture has higher refraction index than the outer current blocking ring to provide lateral index guiding.

36. The apparatus or method of any preceding embodiment, wherein the inner current injection aperture and the outer current blocking ring can be selected by the following combination: GaAs (aperture)/InGaP (ring), AlGaAs/InGaP, GaAs/InAlGaP, AlGaAs/InAlGaP, InGaAs/InP, InAlGaAs/InP.

37. The apparatus or method of any preceding embodiment, wherein the inner current injection aperture can be any shapes such as circular, triangle, square, rectangle and so on so forth with dimension from 100 nm to 50 µm .

38. The apparatus or method of any preceding embodiment, wherein the index-guiding current confinement layer can be 10 nm to 2000 nm thick.

39. The apparatus or method of any preceding embodiment, wherein the vertical cavity surface emitter can be a vertical cavity surface emitting laser (VCSEL) or a resonant-cavity light emitting diodes (RCLEDs). It can be either electrical pumped device or optical pumped device.

40. The apparatus or method of any preceding embodiment, wherein the bottom mirror can be a stack of distributed Bragg reflector or a high contrast grating thin layer reflector.

41. The apparatus or method of any preceding embodiment, wherein the distributed Bragg reflector can be flat or distorted due to the conformal second growth.

42. The apparatus or method of any preceding embodiment, wherein the high contrast grating reflector can be flat or distorted due to the conformal second growth.

43. The apparatus or method of any preceding embodiment, wherein the active region includes quantum well or quantum wells and cladding layers on both sides of the quantum-well or quantum-wells.

44. The apparatus or method of any preceding embodiment, wherein the quantum well or quantum wells comprise a well layer and a barrier layer.

As used herein, the singular terms "a," "an," and "the" may include plural referents unless the context clearly dictates otherwise. Reference to an object in the singular is not intended to mean "one and only one" unless explicitly so stated, but rather "one or more."

As used herein, the term "set" refers to a collection of one or more objects. Thus, for example, a set of objects can include a single object or multiple objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A vertical cavity surface emitting optoelectronic apparatus comprising:
   (a) a top reflector and bottom reflector;
   (b) a first contact layer above said bottom reflector and having a first type of doping;
   (c) an active region located above said first contact layer and containing one or more quantum well layers;
   (d) a second contact layer above said active region and having a second type of doping;
   (e) a current blocking ring with a center aperture above said second contact layer and having a first type of doping;
   (f) a third contact layer, located above and filling the center aperture of said current blocking ring, and having a second type of doping;
   (g) wherein the refractive index of the material of the current blocking ring is lower than the refractive index of the material of the third contact layer;
   (h) wherein said second contact layer and said third contact layer interface with each other inside the center aperture of the current blocking ring;
   (i) wherein said third contact layer is injecting current into the second contact layer through the center aperture;
   (j) wherein said second contact layer and said third contact layer as well as the current blocking ring are material which remains free of ion-implantation, is unoxidized, single crystalline, and contains in-situ doped epitaxial materials;
   (k) wherein the material of the current blocking ring has been etched selectively over the material of the second contact layer; and
   (l) wherein the third contact layer and subsequent layers provide for increasing planarization of the center aperture.

2. The apparatus of claim 1, wherein said apparatus comprises a vertical-cavity surface-emitting laser (VCSEL) or a resonant-cavity light-emitting diode (RC-LED).

3. The apparatus of claim 2, wherein said vertical-cavity surface-emitting laser (VCSEL) or resonant-cavity light-emitting diode (RC-LED), comprises an electrically pumped device or an optically pumped device.

4. The apparatus of claim 1, wherein said one or more quantum well layers are sandwiched between cladding layers.

5. The apparatus of claim 1, further comprising electrodes comprising a bottom electrode and top electrode.

6. The apparatus of claim 5, wherein said bottom electrode is beneath a substrate which is beneath said bottom reflector.

7. The apparatus of claim 5, wherein said bottom electrode is on top of said first contact layer.

8. The apparatus of claim 5, wherein said top electrode is on top of said top reflector.

9. The apparatus of claim 5, wherein said top electrode is on top of said third contact layer.

10. The apparatus of claim 1, wherein said apparatus is formed with at least one mesa.

11. The apparatus of claim 1, wherein the index-guiding current confinement layer is configured as an as-grown layer for which no further oxidation or ion implantation is performed after epitaxy.

12. The apparatus of claim 1, wherein said index-guiding current confinement layer comprises an inner current injection aperture and an outer current blocking ring which are distributed laterally in said index-guiding current confinement layer.

13. The apparatus of claim 12, wherein said inner current injection aperture is conductive to said second contact layer to define a current channel into said active region.

14. The apparatus of claim 12, wherein said outer current blocking ring is either of a sufficiently high resistance, or is oppositely doped to said second contact layer, to confine current into said inner current injection aperture in said index-guiding current confinement layer.

15. The apparatus of claim 12, wherein said inner current injection aperture has a higher refraction index than said outer current blocking ring toward providing lateral index guiding.

16. The apparatus of claim 12, wherein said inner current injection aperture and said outer current blocking ring can be selected from the group of aperture/ring material pairs consisting of: GaAs/InGaP, AlGaAs/InGaP, GaAs/InAlGaP AlGaAs/InAlGaP, InGaAs/InP, InAlGaAs/InP.

17. The apparatus of claim 12, wherein said inner current injection aperture is circular having a diameter in a range from approximately 100 nm to 50 µm.

18. The apparatus of claim 12, wherein said inner current injection aperture can be of a non-circular shape having a width in a range from approximately 100 nm to 50 µm.

19. The apparatus of claim 1, wherein said index-guiding current confinement layer has a thickness in a range from approximately 10 nm to 2000 nm.

20. The apparatus of claim 1, wherein said bottom reflector and said top reflector comprises either a distributed Bragg reflector (DBR) or a high-contrast grating (HCG) reflector.

21. The apparatus of claim 20, wherein said top reflector is either flat or distorted from conformal second growth.

22. The apparatus of claim 1, wherein said active region includes quantum well or quantum wells and cladding layers on both sides of said quantum-well or quantum-wells.

23. The apparatus of claim 22, wherein each quantum well comprises a well layer and a barrier layer.

* * * * *